United States Patent [19]

Young et al.

[11] Patent Number: 4,631,481
[45] Date of Patent: Dec. 23, 1986

[54] N.M.R. SHIMS

[75] Inventors: Ian R. Young, Sunbury-on-Thames; Philip R. Evans, Bath; Peter A. Luker, Wembley, all of England

[73] Assignee: Picker International Limited, Middlesex, England

[21] Appl. No.: 694,424

[22] Filed: Jan. 24, 1985

[30] Foreign Application Priority Data

Jan. 30, 1984 [GB] United Kingdom ............... 8402360

[51] Int. Cl.$^4$ ........................................... G01R 33/22
[52] U.S. Cl. ................................... 324/320; 324/300; 324/318; 324/319; 428/343
[58] Field of Search ................. 428/344, 343, 356; 324/300, 319, 320, 318

[56] References Cited

U.S. PATENT DOCUMENTS

| 3,569,823 | 3/1971 | Golay | 324/320 |
| 3,598,647 | 8/1971 | Von Alten et al. | 428/344 |
| 4,110,236 | 8/1978 | Molina | 252/62.54 |

FOREIGN PATENT DOCUMENTS

| 0067933A | 12/1982 | European Pat. Off. |
| 0080160 | 1/1983 | European Pat. Off. |
| 2855134 | 6/1979 | Fed. Rep. of Germany |
| 2463490 | 2/1981 | France |
| 56-104057 | 8/1981 | Japan | 428/344 |
| 1057348 | 2/1967 | United Kingdom |
| 1073567 | 6/1967 | United Kingdom |
| 1339791 | 10/1970 | United Kingdom |
| 1227073 | 3/1971 | United Kingdom |
| 1226181 | 3/1971 | United Kingdom |
| 1305768 | 7/1973 | United Kingdom |
| 1330982 | 9/1973 | United Kingdom |
| 1362720 | 8/1974 | United Kingdom |
| 1413884 | 12/1975 | United Kingdom |
| 1531587 | 11/1978 | United Kingdom |
| 2134128 | 8/1984 | United Kingdom |

OTHER PUBLICATIONS

Zupancic, "Current Shim for High Resolution Nuclear Magnetic Resonance on the Problem of Correcting Magnetic Field Inhomogeneities", Nuclear Institute J. Stefan, Ljubljana, Yugoslavia, 1962, pp. 621–624.

Primary Examiner—Allan M. Lieberman
Attorney, Agent, or Firm—Watts, Hoffmann, Fisher & Heinke Co.

[57] ABSTRACT

A magnetic shim for an N.M.R. apparatus comprises a deformable body (particularly a flexible sheet) of electrically insulating material (e.g. P.V.C.) within which magnetic material (e.g. γ-ferric oxide or barium ferrite) is dispersed. The shim may easily be attached (e.g. by an adhesive backing layer) to an inside wall of the apparatus and may suitably be cut to size until suitable magnetic compensation is achieved by trial and error. The nature of the compensation effected by the shim may be altered by employing different magnetic materials dispersed within the non-conducting material and/or by varying their concentration.

6 Claims, 1 Drawing Figure

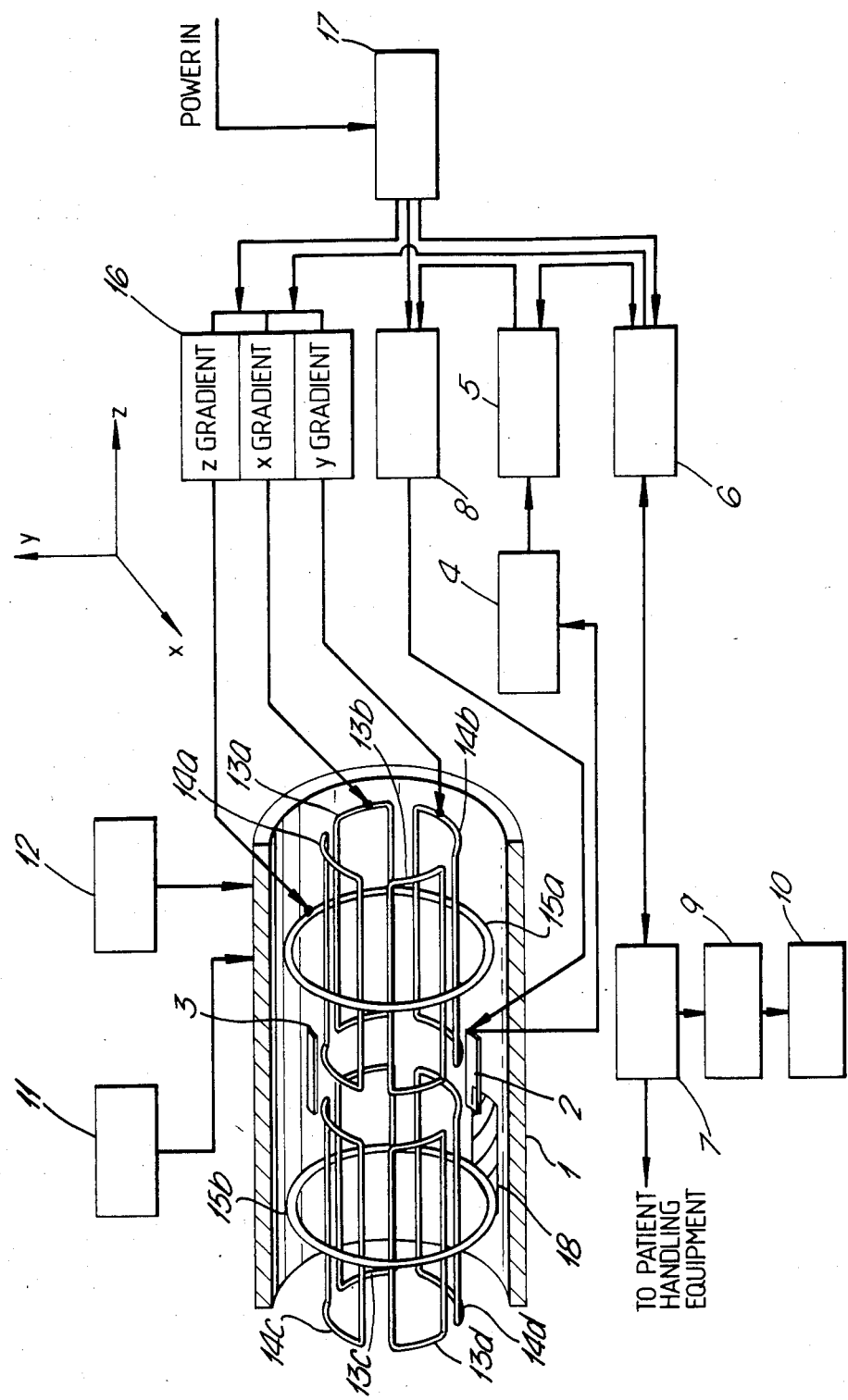

N.M.R. SHIMS

The present invention relates to magnetic shims for use in nuclear magnetic resonance (N.M.R.) apparatus and is particularly but not exclusively concerned with magnetic shims for the compensation of inhomogeneities in the magnetic fields of N.M.R imaging apparatus of the type used in examination of patients for medical purposes.

A requirement of all N.M.R. apparatus, and particularly medical N.M.R. scanners, is that the magnetic field should be homogenous throughout at least the major portion of the volume enclosed by the magnet coils, typically to within 10 parts per million or less. Such a tolerance cannot be reproducibly achieved by conventional techniques of coil construction, and hence in practice it is necessary to measure the magnetic field inhomogeneities in each individual N.M.R. machine and compensate for them with appropriately positioned shims of appropriate dimensions.

Magnetic shims can be classified as either active (current-carrying coils) or passive (ferromagnetic) and in practice the two types differ appreciably in their characteristics and modes of application. Each turn of a planar current-carrying coil generates a field within its enclosed area and must therefore be considered as a distributed source of magnetic compensation. Conversely passive shims (which hitherto have been made of iron) have only been used as point sources or line sources (in the case of an iron rod for example) of compensation. Considerably difficulties arise when iron shims of appreciable area are placed in the magnetic field of an N.M.R. machine, because the electrical conductivity of the iron causes interference with the R.F. coils of the machine and (if the machine is a scanner) also distorts any changing magnetic field by the action of induced eddy currents. Consequently, compensation of magnetic field inhomogeneities in N.M.R. apparatus has hitherto been achieved by using current-carrying shim coils. These are awkward to position, cannot easily be adjusted, and require a carefully controlled source of current to be effective.

Iron shims can also be disadvantageous even when used as point sources of compensation, since they frequently cannot conveniently be firmly attached to a suitable part of the apparatus and may partially saturate in use and hence distort any changing fields used.

A further difficulty arises in NMR imaging apparatus, such as that used in the examination of patients for medical purposes, wherein changing magnetic field gradients are applied to enable different parts of the patient to be distinguished. In such apparatus a two or three dimensional image of part of a patient is constructed in terms of proton density, spin-lattice relaxation time ($T_1$), spin-spin relaxation time ($T_2$) or combination of these parameters.

An object of the present invention is to provide a magnetic shim which alleviates at least some of the above disadvantages.

According to one aspect of the present invention, a magnetic shim for an N.M.R. apparatus comprises a deformable body of substantially non-electrically conducting material within which magnetic material is dispersed. The deformable body may be deformable either at room temperature or on heating.

The magnetic material may be either magnetically soft with low hysteresis losses or may be magnetically hard. Thus γ-ferric oxide has a coercivity of approximately 0.03T and will therefore saturate in an N.M.R. magnetic field (typically 0.15T) whereas barium ferrite will remain unsaturated. Hence materials such as γ-ferric oxide will make a constant contribution to the flux density B and may be used to compensate for constant magnetic inhomogeneities attributable to the main magnetic field coils whereas materials such as barium ferrite will generate a component of flux density B proportional to the applied magnetic field strength H and may be used to compensate for inhomogeneities in changing magnetic fields attributable to magnetic field gradient coils.

Since the magnetic material is dispersed within a non-conducting body, said material may itself be metallic —for example iron powder or powders of other magnetic metals or alloys may be used.

The deformable body may be in the form of a flexible sheet or strip of, for example plastics material such as P.V.C. and may incorporate an adhesive backing.

The sheet may be cut to shape with a knife or scissors before being applied.

The concentration of the magnetic material may vary in a predetermined manner over the area of the sheet.

The deformable body need not be resilient but may be in the form of a putty or paste which can adhere to a suitable supporting surface.

However the deformable body should not contain mobile active nuclei (i.e. hydrogen in conventional hydrogen N.M.R. machines) and should not therefore incorporate hydrogen-containing liquids such as water if used in a hydrogen N.M.R. apparatus.

The deformable body may be of thermoplastic material such as perspex so that it may be heated and softened before being pressed against a suitable support in the N.M.R. apparatus.

According to another aspect of the invention, in a method of reducing magnetic field inhomogeneities in N.M.R. apparatus, a deformable substantially non-electrically conducting body incorporating dispersed magnetic material is cut to size and applied to a supporting surface of the N.M.R. apparatus.

Said body may be used as a point source of magnetic compensation or may be in the form of a strip or sheet of appreciable dimensions (greater than 10 cm minimum dimension) to act as a distributed source of magnetic compensation.

The body may have any of the features referred to hereinabove.

The invention includes within its scope N.M.R. apparatus compensated by magnetic shims in accordance with with of the above aspects of the invention.

One embodiment of the invention will now be described by way of example with reference to the accompanying drawing, which is a schematic representation, partially cut away in the yz plane, of an N.M.R. body scanner.

The scanner shown comprises a Helmholz coil arrangement 1 which generates a nominally uniform magnetic field of 0.15T within its enclosed volume, the direction of this field being along the z axis. Coil arrangement 1 is cooled by a cooling system 11 and activated by a controlled power supply 12. R.F. coils 2 and 3 are each connected to an R.F. power transmitter 8 and are used to excite and pick up N.M.R. signals in a patient (not shown) lying in the z direction within the coil arrangement 1.

The N.M.R. output signals are amplified in a preamplifier 4, analysed in an R.F. spectrometer 5 and processed in a computer 6 under the control of an operator console 7, which is in turn linked to a viewing console 9 and multi-format camera 10. Three sets of magnetic field gradient coils; namely 13a to 13d, 14a to d, 15a and 15b generate controlled nominally linear magnetic field gradients in the x, y and z directions respectively, in response to a field controller 16. The overall operation of the apparatus is controlled by a system interlock 17. As described thus far, the N.M.R. apparatus shown is known and its mode of operation will not therefore be described in detail.

Any inhomogeneity in either the main field in the z direction generated by coil arrangement 1 or any of the x, y and z gradient fields will cause a blurring or distortion of the image. Accordingly the invention provides a magnetic shim 18 in the form of a flexible sheet, approximately 2 mm thick, of P.V.C. loaded with γ-ferric oxide.

The sheet may be cut with scissors to give a shape and size appropriate to compensate for any measured longitudinal or circumferential inhomogeneity in the field of coil arrangement 1. Such inhomogeneities may be detected and measured by known methods using a suitable probe of known type to measure the local field in a large number of predetermined positions within the coil arrangement 1. The shim 18 is provided with an adhesive backing layer to enable it to be stuck to an appropriate part of the inside surface of the coil arrangement 1. Since the iron oxide in the shim will saturate in the 0.15T field of the coil arrangement 1, it will make a constant contribution to the flux density B, irrespective of any gradient field applied by coils 13, 14 or 15. Thus shim 18 independently compensates for field inhomogeneities attributable to coil arrangement 1. The required shape of shim 18 may be calculated in accordance with known theory, but if necessary a new shim of slightly different shape may be substituted for shim 18 if the required compensation is not achieved initially. Thus fine compensation can be achieved by trial and error, supplemented by calculation if necessary. If necessary, strips of γ-ferric oxide loaded P.V.C. can be used to give line compensation, or small pieces (of area less than say 100 cm$^2$), may be used to give point compensation.

Apart from any compensation of the fixed field from coil arrangement 1, inhomogeneities in the gradient fields from coils 13, 14 and 15 can be compensated for in a similar manner by using P.V.C. sheets identical to sheet 18 but loaded with barium ferrite or other magnetic material which has a coercivity greater than (say) 0.15T instead of γ-ferric oxide. The flux density contribution B attributable to such an unsaturated shim will increase with field strength H in a linear or near linear fashion and will therefore compensate for positioning errors of the gradient coils. However the static field due to coil arrangement 1 will also be affected, and accordingly it will generally be necessary to use an appropriate combination of saturable and non-saturable shims to provide dynamic field compensation.

It will be appreciated that the magnetic behaviour of a shim in accordance with the invention will depend not only on the inherent characteristics of the ferromagnetic material used, but also on the degree of dispersion of this material within the non electrically conducting material of the shim. Thus a suitable ferromagnetic material may be used in a low concentration to produce a magnetically soft (non-saturating) shim or in a high concentration to produce a magentically hard (saturating) shim.

We claim:

1. A method of reducing magnetic field inhomogeneities in N.M.R. apparatus, said method comprising the steps of cutting to size a deformable substantially non-electrically conducting body incorporating dispersed magnetic material but containing substantially no hydrogen nuclei and applying said body to a supporting surface of the N.M.R. apparatus.

2. A method according to claim 1 wherein at least one of said steps is repeated until compensation is achieved by trial and error.

3. A method according to claim 1 wherein said body is in the form of a flexible sheet.

4. A method according to claim 3 wherein said sheet incorporates an adhesive backing layer.

5. A method according to claim 1 wherein said magnetic material is saturated in use of said N.M.R. apparatus.

6. A method as claimed in claim 1 of reducing inhomogeneities in the gradient fields of magnetic coils in N.M.R. imaging apparatus, wherein said magnetic material exhibits a substantially linear magnetisation curve in use of said N.M.R. apparatus.

* * * * *